(12) United States Patent
You et al.

(10) Patent No.: US 11,428,721 B2
(45) Date of Patent: Aug. 30, 2022

(54) INDUCTANCE AND CURRENT FLOW ESTIMATIONS

(71) Applicant: Infineon Technologies Austria AG, Villach (AT)

(72) Inventors: Zhiqing You, Torrance, CA (US); Tim Ng, Monterey Park, CA (US)

(73) Assignee: Infineon Technologies Austria AG, Villach (AT)

( * ) Notice: Subject to any disclaimer, the term of this patent is extended or adjusted under 35 U.S.C. 154(b) by 48 days.

(21) Appl. No.: 16/891,261

(22) Filed: Jun. 3, 2020

(65) Prior Publication Data

US 2021/0382094 A1   Dec. 9, 2021

(51) Int. Cl.
*G01R 19/25* (2006.01)
*G01R 19/165* (2006.01)
*G01R 19/257* (2006.01)
*H02M 7/00* (2006.01)

(52) U.S. Cl.
CPC ....... *G01R 19/2513* (2013.01); *G01R 19/165* (2013.01); *G01R 19/257* (2013.01); *H02M 7/003* (2013.01)

(58) Field of Classification Search
None
See application file for complete search history.

(56) References Cited

U.S. PATENT DOCUMENTS

| 8,829,879 B2* | 9/2014 | Latham, II | H02M 3/156 323/285 |
| 10,361,554 B1 | 7/2019 | Demski et al. | |
| 2008/0043393 A1* | 2/2008 | Petkov | H03K 17/0822 361/103 |
| 2015/0323570 A1 | 11/2015 | Guthrie et al. | |
| 2015/0349634 A1* | 12/2015 | Tschirhart | G01R 19/25 323/271 |
| 2017/0237364 A1 | 8/2017 | Safamehr et al. | |
| 2018/0175733 A1 | 6/2018 | Hartman et al. | |
| 2018/0262108 A1* | 9/2018 | Luo | H02M 3/1588 |

OTHER PUBLICATIONS

Extended European Search Report, EP 21 17 6767.8, dated Sep. 30, 2021, pp. 1-7.

* cited by examiner

*Primary Examiner* — Daniel C Puentes
(74) *Attorney, Agent, or Firm* — Armis IP Law, LLC

(57) ABSTRACT

An apparatus includes a power converter and an estimator. The power converter produces an output voltage to power a load via current through an inductor. The estimator receives a current sense signal from a current monitor resource. The current sense signal represents/indicates a measured magnitude of the current supplied to the load through the inductor over time during one or more power delivery control cycles. Portions of the current sense signal may be an inaccurate representation of an amount of current through the inductor. Via the current sense signal, or portion thereof, the estimator determines (such as calculates) an inductance (value) of the inductor. The estimator then uses the calculated inductance value to estimate a magnitude of the output current supplied through the inductor to the load.

32 Claims, 10 Drawing Sheets

INDUCTANCE AND CURRENT FLOW ESTIMATIONS

BACKGROUND

One type of conventional power converter is a buck converter. In general, to maintain an output voltage within a desired range, a controller in the buck converter compares the magnitude of a generated output voltage to a setpoint reference voltage. Based on a respective error voltage, the controller modifies a respective switching frequency and/or pulse width modulation associated with activating high side switch circuitry or low side switch circuitry in the buck converter.

In certain instances, the controller controls operation of the buck converter based on an amount of output current supplied by a generated output voltage to a load.

The output current can be measured in any suitable manner such as DCR current sensing across an inductor, current mirroring, sense resistance of switch circuitry, etc. In different conventional implementations, a corresponding analog-to-digital converter (ADC) monitors the output current tends to be slow and inaccurate.

BRIEF DESCRIPTION

This disclosure includes the observation that conventional power supply monitoring and control techniques suffer from deficiencies. For example, it is often difficult but desirable to more precisely know a magnitude of output current delivered by a respective power converter to a load in order to generate appropriate power supply control signals.

Inductor current sense accuracy depends on a controller's estimation and current sense input signal accuracy. To estimate the magnitude of output current, users have to enter an inductance value associated with a respective inductor of the power supply. The inductance value is used as a basis to determine an amount of current supplied to the load. It is observed that the actual inductance of the inductor varies over temperature, load current, fabrication inaccuracies, etc. This introduces errors associated with estimating the actual output current of a power converter.

Embodiments herein include novel ways of determining an inductance of an inductor and then estimating a magnitude of the output current based on the determined inductance.

More specifically, embodiments herein include an apparatus comprising a power converter and an estimator. The power converter produces an output voltage to power a load via current through an inductor. The power converter is at least partially inductor-based. The estimator (hardware or software processing engine) receives a current sense signal from a current monitor resource. The current sense signal represents a magnitude of the current supplied through the inductor over time during one or more power delivery control cycles. Via the current sense signal, the estimator determines an inductance (value) of the inductor.

In accordance with further example embodiments, the current sense signal is at least partially inaccurate. The estimator provides a better estimate of a magnitude of the output current supplied through an inductor to the load based on the determined inductance of the inductor.

In still further example embodiments, the power converter includes a controller that converts an input voltage into an output voltage. The controller controls operation of the power converter circuit based at least in part on the estimated magnitude of the output current as generated from the determined inductance of the inductor.

Further embodiments herein, via the estimator, repeatedly calculating the inductance of the inductor over multiple power delivery control cycles of the power converter producing the output voltage. If desired, multiple determined inductance values can be filtered to provide an average (such as moving average) inductance of the inductor for multiple power delivery control cycles.

Note further that the estimator can be configured to estimate a magnitude of the inductance associated with the inductor in any way. For example, in one embodiment, the estimator determines (such as estimates, calculates, looks up, etc.) a magnitude of the output current supplied to the load based one or more parameters such as: i) the determined inductance of the inductor, ii) a magnitude of an input voltage of the power converter, the power converter operative to convert the input voltage into the output voltage, iii) a magnitude of the output voltage of the power converter powering the load, etc.

In still further example embodiments, the estimator determines the inductance based on a slope of the current sense signal.

In accordance with further example embodiments, via the current sense signal, the estimator: i) selects a window of time; ii) measures a change in a magnitude of the current sense signal during the window of time; and iii) derives the inductance (value) of the inductor based on a combination of a duration of the window of time and the change in the magnitude of the current sense signal.

Note that the power converter can be implemented in any suitable manner. For example, in one embodiment, the power converter includes high side switch circuitry and low side switch circuitry. A controller of the power converter activates the high side switch circuitry and low side switch circuitry at different times during a power delivery control cycle to control a magnitude of the output current through the inductor. The estimator as described herein selects a window of time in the power delivery control cycle to be within a duration of time in which the low side switch circuitry is activated. In a manner as further described herein, based on the current sense signal in the window of time, the estimator determines an inductance value for the inductor.

Via still further example embodiments as described herein, there is no need to place the power converter and corresponding power supply in a test mode to determine a magnitude of the inductance of the inductor. For example, in one embodiment, the estimator determines the inductance of the inductor while the power converter uses the inductor component to generate output current to power the load. Thus, in one embodiment, the estimator determines the inductance of the inductor during a full power supply operation mode in which the power converter drives load with a respective output voltage. If desire, an initial value of the inductor can be stored in memory. If the determined inductance differs by the stored initial value greater than a threshold value, the power converter can be configured to provide notification that the inductor component has failed.

Yet further embodiments herein include, at the estimator, receiving the current sense signal from a current monitor. In one embodiment, the current monitor produces the current sense signal based on a change in voltage across a sense resistor in the power converter. The change in voltage is caused by a variations in a magnitude of the output current through the sense resistor (and thus inductor). Because the same current passes through both the sense resistor and the inductor, the current sense signal derived from the voltage across the sense resistor (component) is generally a good indication of the amount of output current through the inductor to the load and/or output capacitor(s).

In one embodiment, via the current sense signal, the estimator determines a change in magnitude of the output current (through the inductor) during a window of time and derives the inductance based at least in part on a duration of the window of time divided by the determined change in magnitude of the output current. In one embodiment, the window of time is smaller than a respective duration of a power delivery control cycle of the power supply.

It is further observed herein that the current sense signal may accurately depict the amount of current through the inductor for one or more first portions of the current sense signal while the current sense signal may be inaccurate in depicting the amount of current through the inductor for one or more second portions of the current sum signal. In such an instance, the one or more first portions of the current sense signal that accurately depict the amount of current through the inductor are used to determine the inductance of the inductor.

More specifically, in one embodiment, the estimator determines the inductance of the inductor based on a sample window of the current sense signal. In one embodiment, the sample window (such as a portion of the current sense signal that is deemed to be more or most accurate) is a less-than-all portion of a power delivery control cycle during which the power converter supplies the output current through the inductor to the load. In one embodiment, the sample window is chosen depending on respective states of switches in the power converter generating the output current.

Subsequent to calculating the inductance of the inductor based upon the more accurate less-than-all portion of the power delivery cycle, the estimator estimates a magnitude of the output current supplied to the load for the entire duration of the power delivery control cycle based on the determined inductance of the inductor. The estimation of inductor current is more accurate than as indicated by the current sense signal itself.

As previously discussed, embodiments herein are useful over conventional techniques. For example, as previously discussed, embodiments herein enable a respective power supply circuit (such as an estimator or other suitable resource) to determine an inductance value of a respective inductor that supplies output current to a load. Calculation of the inductance eliminates the need for a fabricator to program the power supply with a value of the inductor, which may be inaccurate. Additionally, accurate determination of the inductance simplifies current monitor circuitry because it need only be accurate during a portion of a power delivery cycle to accurately determine the inductance, which is then used to produce a more accurate depiction of the inductor over an entirety of each power delivery control cycle of supplying current to the load.

These and other more specific embodiments are disclosed in more detail below.

Note that although embodiments as discussed herein are applicable to power converters, the concepts disclosed herein may be advantageously applied to any other suitable topologies as well as general power supply control applications.

Note that any of the resources as discussed herein can include one or more computerized devices, mobile communication devices, servers, base stations, wireless communication equipment, communication management systems, workstations, user equipment, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to methods, systems, computer program products, etc., that support operations as discussed herein.

One embodiment herein includes a computer readable storage medium and/or system having instructions stored thereon. The instructions, when executed by computer processor hardware, cause the computer processor hardware (such as one or more co-located or disparately located processor devices) to: receive a current sense signal representing a magnitude of output current supplied through an inductor of a power converter to a load; determine an inductance of the inductor based on the current sense signal; and control operation of the power converter based on the determined inductance.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of implementing one or more inductor components to deliver current to a load. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

Figure 1:
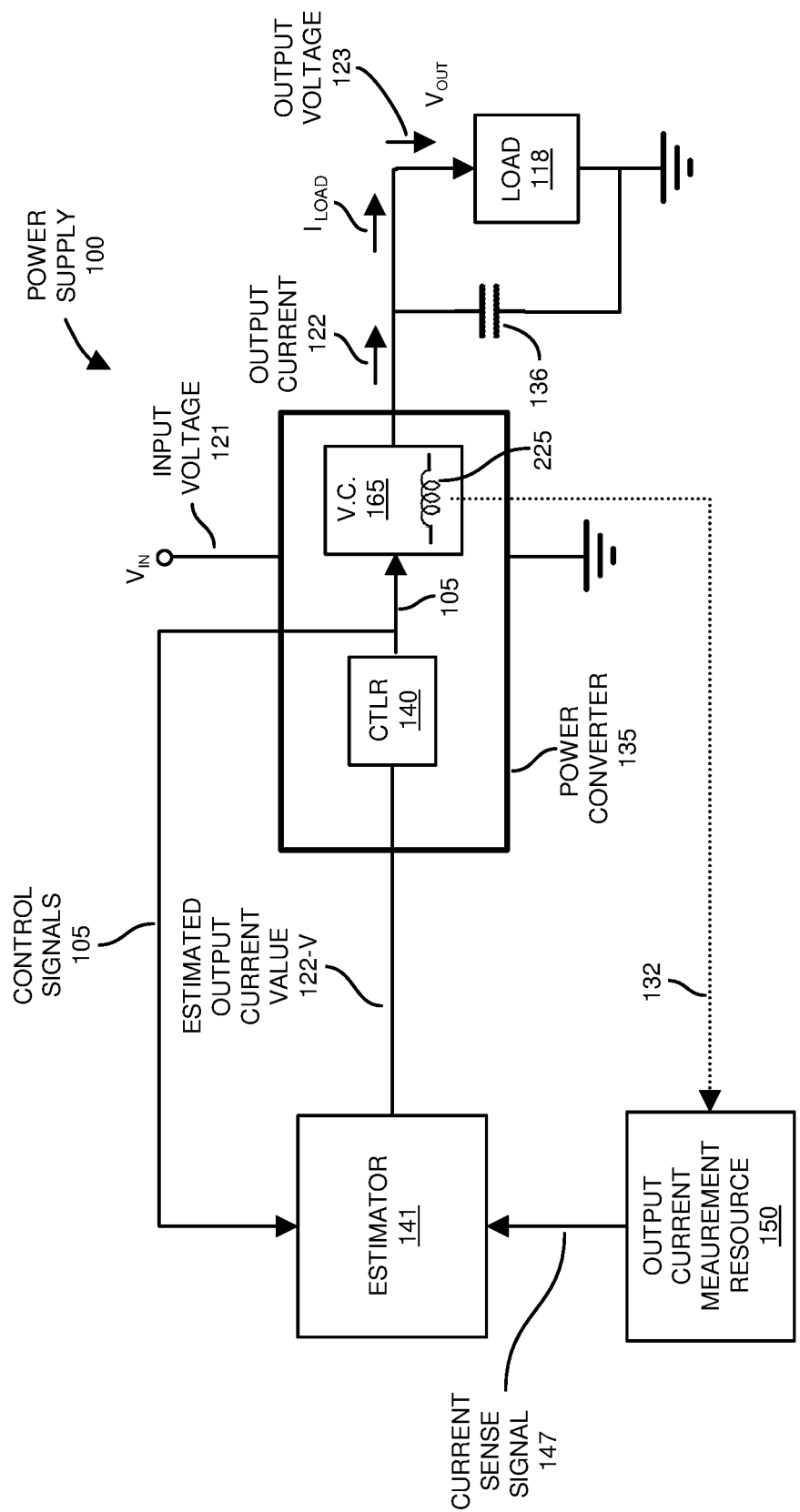
FIG. 1 is an example general diagram of a power supply supporting inductance and current estimation according to embodiments herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Embodiments herein include an apparatus comprising a power converter and a current estimator. The power converter produces an output voltage to power a load via current through an inductor. The estimator receives a current sense signal from a current monitor resource. The current sense signal represents a measured magnitude of the current supplied to the load through the inductor over time during one or more power delivery control cycles. Via the current sense signal, the estimator first determines an inductance (value) of the inductor. The estimator then uses the estimated inductance value to further determine a magnitude of the output current supplied through the inductor to the load.

Now, more specifically, FIG. 1 is an example general diagram of a power supply supporting inductance measurements and inductor current estimation according to embodiments herein.

In this example embodiment, the power supply 100 includes power converter 135, estimator 141, and output current measurement resource 150. Power converter 135 includes controller 140 and voltage converter 165. During operation, the power converter 135 (and voltage converter 135) converts the input voltage 121 into the output voltage 118 that powers the load 118.

As shown, output current measurement resource 150 receives one or more signals 132 (such as feedback signals associated with the voltage converter 165). Via the one or more signals 132, in one embodiment, the output current measurement resource 150 physically measures the output current 122 supplied through the inductor 225 to the combination of capacitor 136 and the load 118.

Based on the feedback signals 132, the output current measurement resource 150 produces current sense signal 147 (i.e., inductor output current information) indicating a magnitude of the output current 122 supplied through the inductor 225.

Note that the output current measurement resource 150 includes any suitable circuitry to monitor an amount of current through the inductor 225. For example, in one embodiment, the output current measurement resource 150 is or includes one or more analog-to-digital converters to measure a voltage across a resistive element (such as being inherent in the inductor 225 itself or a separate component) in the power converter through which the output current 122 flows.

As a further non-limiting example embodiment, the output current measurement resource 150 can be configured to include one or more analog-to-digital converters and/or corresponding circuitry that produces the actual sample measurements of the output current 122. This can include a technique such as measuring the voltage across the inductor 225 of the corresponding power converter 165 and implements DCR measurements to detect the output current 122.

Alternatively, embodiments herein include monitoring a voltage of a resistive element such as an RDSON (resistance of high side switch circuitry and/or low side switch circuitry between the drain and source nodes) through which the output current 122 flows when the low side switch circuitry is ON.

Yet further embodiments include determining a magnitude of the output current 122 via current mirroring techniques.

Thus, any alternative or suitable type of physical measurements can be implemented to detect a magnitude or change in magnitude of the inductor output current 122

As further shown, and as previously discussed, the power supply 100 includes estimator 141. The estimator 141 determines (such as via one or more of estimating, calculating, looking up an inductance via a look up table based on implementation of artificial intelligence, etc.) an inductance of the inductor 225. Thereafter, based on the determined inductance of the inductor 225, the estimator 141 estimates a magnitude of the output current 122 through the inductor 225, providing the controller 140 a more accurate depiction of the magnitude of the output current 122 (using actual inductance) than the current sense signal 147.

As a more specific example, as shown, the power converter 135 produces an output voltage 123 (Vout) to power a load 118 via output current 122 supplied by the inductor 225.

In one embodiment, to determine the magnitude of the inductor 225, the estimator 141 receives the current sense signal 147 from output current measurement resource 150 (i.e., a current monitor resource). The current sense signal 147 represents a magnitude of the output current 122 supplied through the inductor 225 over time during one or more power delivery control cycles. Via the current sense signal 147, the estimator 141 determines an inductance (value) of the inductor 225.

In accordance with further example embodiments, the estimator 141 repeatedly determines the inductance of the inductor 225 over multiple power delivery control cycles of the power converter producing the output voltage 123. If desired, the estimator 141 filters the multiple determined inductance values to provide an average (such as moving average) inductance of the inductor 225 for multiple power delivery control cycles.

Note again that, in one embodiment, there is no need to place the power converter 135 and corresponding power supply 100 in a test mode to determine a magnitude of the inductance L225 of the inductor 225. For example, in one embodiment, the estimator 141 determines the inductance value L225 of the inductor 225 while the power converter 165 uses the inductor 225 component to generate output current 122 to power the load 118. Thus, in one embodiment, the estimator 141 determines the inductance value L225 of the inductor 225 during a power supply operational mode in which the power converter 165 drives load 118 with a respective output voltage 123.

Figure 2:
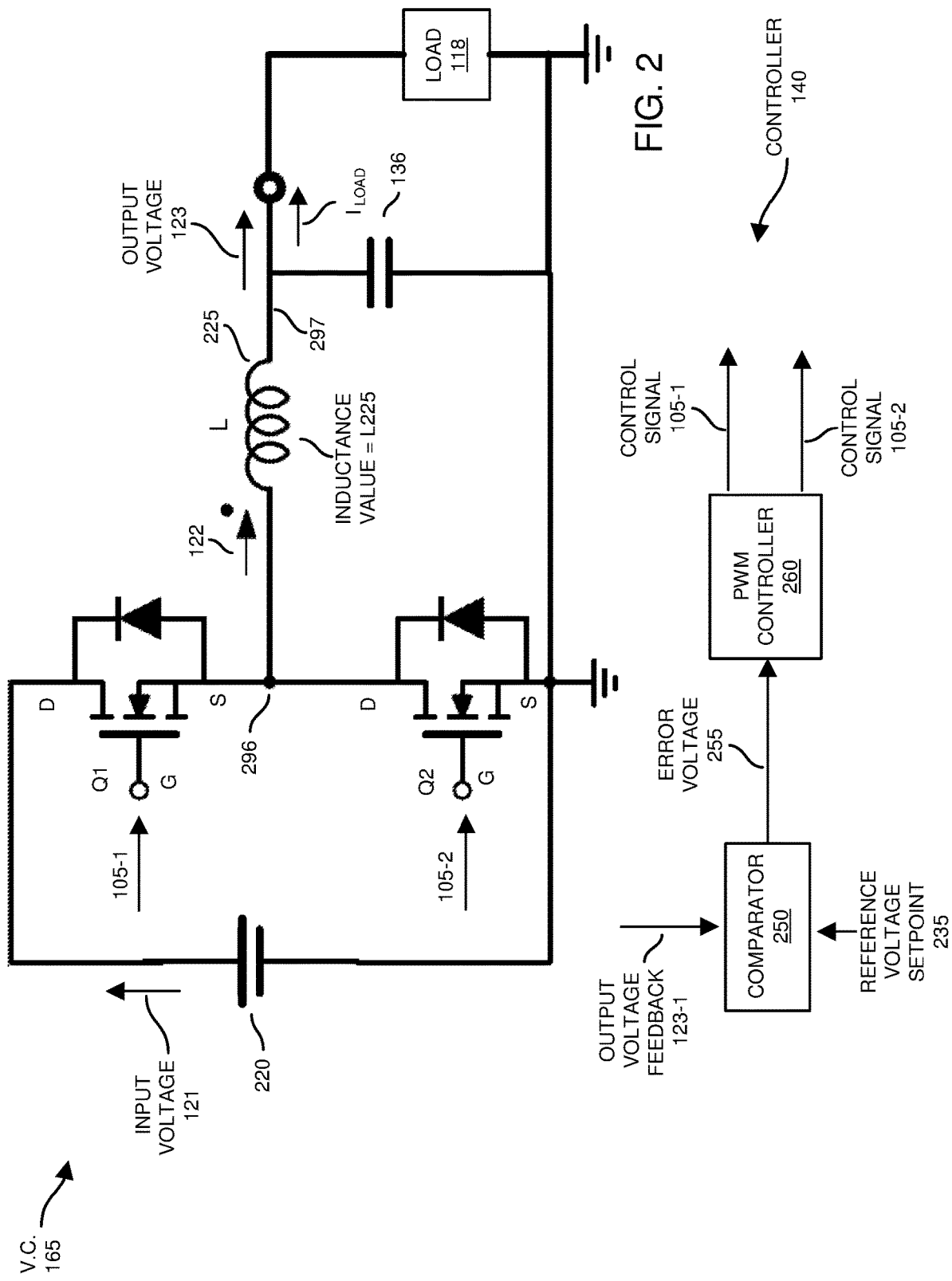
FIG. 2 is an example diagram illustrating a power converter according to embodiments herein.

FIG. 2 is an example diagram illustrating a power converter according to embodiments herein.

In this non-limiting example embodiment, the voltage converter 165 is configured as a buck converter including voltage source 220 (providing input voltage 121), switch Q1, switch Q2, inductor 225, and output capacitor 136.

Although the voltage converter 165 in FIG. 2 is shown as a buck converter configuration, note again that the voltage converter 165 can be instantiated as any suitable type of voltage converter and include any number of phases, providing regulation as described herein.

As shown in this example embodiment, the switch Q1 of voltage converter 165 is connected in series with switch Q2 between the input voltage 121 and corresponding ground reference. As previously discussed, the voltage converter 165 further includes inductor 225. Inductor 225 extends from the node 296 to the output capacitor 136 and dynamic load 118.

Via switching of the switches Q1 and Q2 based on respective control signals 105-1 (applied to gate G of switch Q1) and 105-2 (applied to gate G of switch Q2), node 296 coupling the source (S) node of switch Q1 and the drain (D) node of switch Q2 provides output current 122 through the inductor 225, resulting in generation of the output voltage 123 powering the load 118.

In one embodiment, the controller 140 controls switching of the switches Q1 and Q2 based on one or more feedback parameters. For example, the controller 140 can be configured to receive output voltage feedback signal 123-1 derived from the output voltage 123 supplied to power the load 118 as previously discussed in FIG. 1. The output voltage feedback signal 123-1 can be the output voltage 123 itself or a proportional derivative thereof using a resistor divider.

Referring again to FIG. 2, via the comparator 250, the controller 140 compares the output voltage feedback signal 123-1 (such as output voltage 123 itself or derivative, or proportional signal) to the reference voltage 235 (FIG. 2). As previously discussed, the reference voltage 235 is a desired setpoint in which to control a magnitude of the output voltage 123 during load-line regulation implemented by the power supply 100. Also, as previously discussed, during load-line regulation, a magnitude of the reference voltage 235 varies depending on the magnitude of the inductor output current 122. Additionally, or alternatively, the reference voltage 235 may be a static value.

The comparator 250 produces a respective error voltage 255 based on the difference between the output voltage feedback signal 123-1 and the reference voltage 235. A magnitude of the error voltage 255 generated by the comparator 250 varies depending upon the degree to which the magnitude of the output voltage 123 is in or out of regulation (with respect to the reference voltage 225).

As further shown, the PWM (Pulse Width Modulation) controller 260 of the controller 140 controls operation of switching the switches Q1 and Q2 based upon the magnitude of the error voltage 255. For example, if the error voltage 255 indicates that the output voltage 123 (of the voltage converter 165) becomes less than a magnitude of the reference voltage 235, the PWM controller 360 increases a duty cycle or frequency of activating the high side switch Q1 (thus decreasing a duty cycle of activating the low-side switch Q2) in a respective switch control cycle.

Conversely, if the error voltage 255 indicates that the output voltage 123 (of the voltage converter 165) becomes greater than a magnitude of the reference voltage 235, the PWM controller 260 decreases a duty cycle or frequency of activating the high side switch Q11 (thus increasing a duty cycle of activating the low-side switch Q2) in a respective switching control cycle.

As is known in the art, the controller 140 controls each of the switches Q1 and Q2 ON and OFF at different times to prevent short-circuiting of the input voltage 121 to the ground reference voltage. For example, when the switch Q1 is activated to an ON state, the switch Q2 is deactivated to an OFF state. Conversely, when the switch Q1 is deactivated to an OFF state, the switch Q2 is activated to an ON state. Note that the controller 240 implements a dead time between state ON-OFF and OFF-ON state transitions to prevent shorting of the input voltage 121 to the ground reference.

Via variations in the pulse with modulation (and/or frequency modulation) of controlling the respective switches Q1 and Q2, the controller 140 controls generation of the output voltage 123 such that the output voltage 123 remains within a desired voltage range with respect to the reference voltage setpoint 235. The following drawings (such as FIGS. 3, 5, 6, and 7) illustrate the magnitude of the inductor output current 122 over time.

Figure 3:
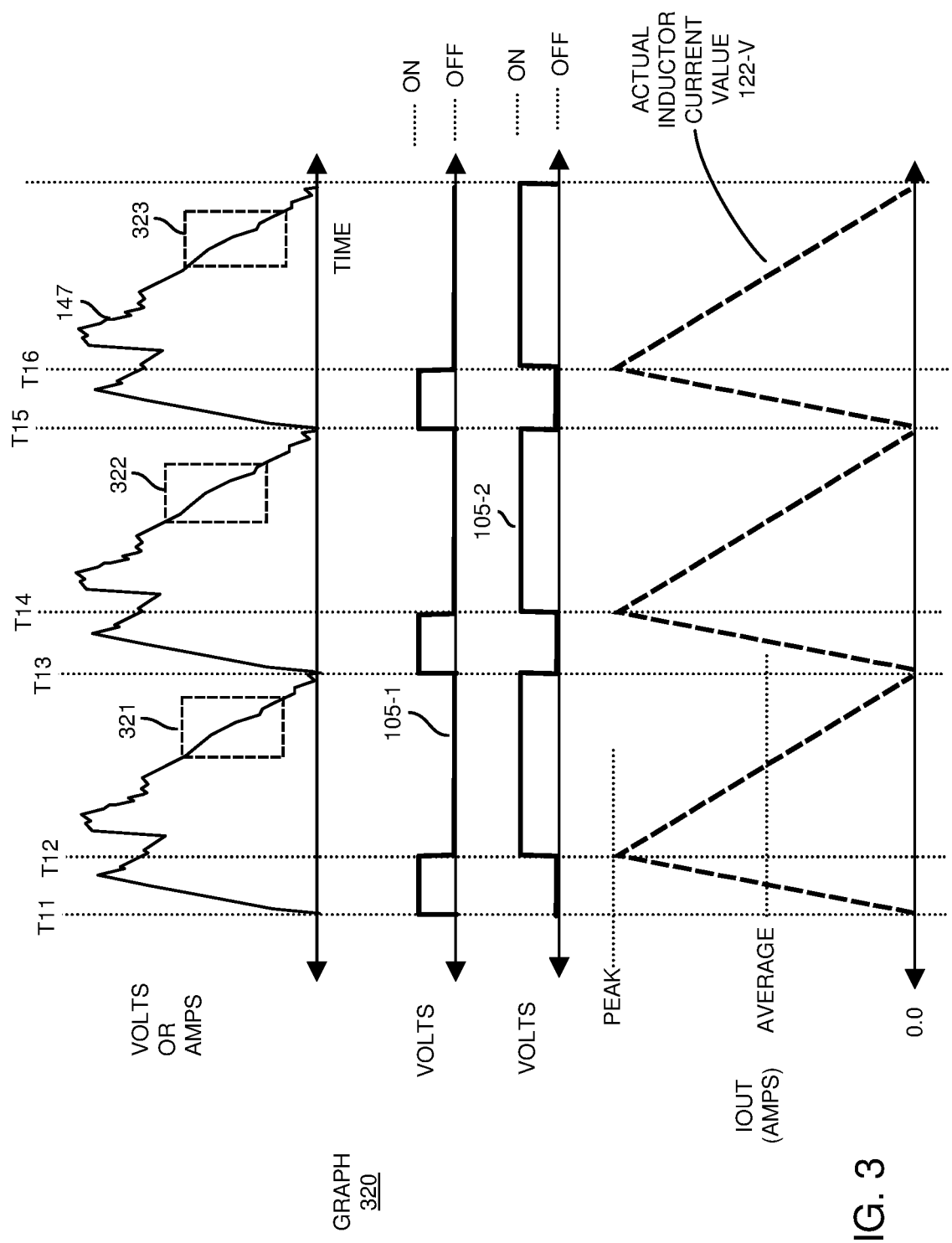
FIG. 3 is an example diagram illustrating control signals and current sense signals representing current through an inductor according to embodiments herein.

FIG. 3 is an example diagram illustrating control signals and current sense signals representing current through an inductor according to embodiments herein.

In this example embodiment, graph 320 illustrates how the different signals such as current sense signal 147 (rough measure of current through the inductor 225 including inaccuracies), control signals 105, and determined current through the inductor 225. Current sense signal 147 is inaccurate at and about time T12, time T14, time T16, etc.

In one embodiment, the current sense signal 147 is measured in volts across a resistive element. However, the signal represents current. In one embodiment, the current sense signal 147 is received in volts and is converted via a gain value indicating how to convert the received current sense signal 147 into amperes.

Alternatively, note that the output current measurement resource 150 can be configured to generate the current sense signal 147 as a measure of amperes. In such an instance, there is no need for the estimator 141 to implement a conversion from volts to amperes.

Regardless of whether the current sense signal 147 is in voltage or amperes, it indicates a magnitude of the inductor output current 122 and how it varies over time.

Further in this example embodiment, as previously discussed, the pulse width modulation controller 260 (controller 140) generates controls signal 105 that drives respective switches Q1 and Q2 of the voltage converter 165.

As previously discussed, control signal 105-1 drives switch Q1; control signal 105-2 drives switch Q2.

When control signal 105-1 is logic high (such as when control signal 105-1 drives switch Q1 to an ON state and control signal 105-2 drives switch Q2 to an OFF state), the change in current through the inductor 225 is as follows:

$$dI=(Vin-Vout)*dT/L$$

where dI=change in inductor output current 122 over time, Vin=the voltage at node 296 (such as 12 VDC in this example because switch Q1 passes the input voltage to node 296), Vout=a magnitude of the output voltage 123 (such as 1.0 VDC in this example), dT=change in time, and L is the inductance of the inductor 225 (such as around 100 nanohenry in this example).

Accordingly, between each of the time ranges T11 to T12, T13 to T14, etc., the actual amount of the output current 122 monotonically increases as shown in graph 320.

Conversely, when control signal 105-1 drives switch Q1 to an OFF state and control signal 105-2 drives switch Q2 to an ON state, the change in current through the inductor 225 is as follows:

$$dI=(-Vout) \times dT/L$$

where dI=change in current over time, the voltage at node 296 (such as OvDC in this example because switch Q2 is ON, Vout=a magnitude of the output voltage 123 (such as 1.0 VDC in this example), dT=sample duration, and L is the inductance of the inductor 225 (such as around 100 nanohenry in this example).

Accordingly, between each of time range T12 and T13, time range T14 and T15, etc., the amount of the output current 122 monotonically decreases as shown in graph 320.

In accordance with further example embodiments, as discussed below, the current sense signal 147 received by the estimator 141 is at least partially inaccurate. Instead of using the full power delivery control cycle between time T11 and T13 to produce a respective inductor value L225 for the inductor 225, the estimator 141 selects window 321 in the power delivery control cycle between time T11 and T13 to produce an inductance value L225 for the power delivery control cycle between time T11 and T13; the estimator 141 selects window 322 in the power delivery control cycle between time T13 and T15 to produce an inductance value L225 for the power delivery control cycle between time T13 and T15; the estimator 141 selects window 323 in the power delivery control cycle between time T15 and T17 to produce an inductance value L225 for the power delivery control cycle between time T15 and T17; and so on.

Note that each of the windows can be selected at any suitable time within a respective power delivery control cycle (first power delivery control cycle between time T11 and T13, second power delivery control cycle between time T13 and T14, and so on).

Via the estimated inductor value L225 associated with inductor 225, the estimator 141 provides a better estimate of a magnitude of the output current 122 supplied through an inductor 225 to the load 118 based on the determined inductance L225 of the inductor 225. For example, based on the determined inductance value L225, as well as a known magnitude of the input voltage 121 and a known magnitude of the output voltage 122, the estimator 141 generates a more accurate representation of the output current 122 as depicted by actual inductor current value 122-V in graph 320.

Figure 4:
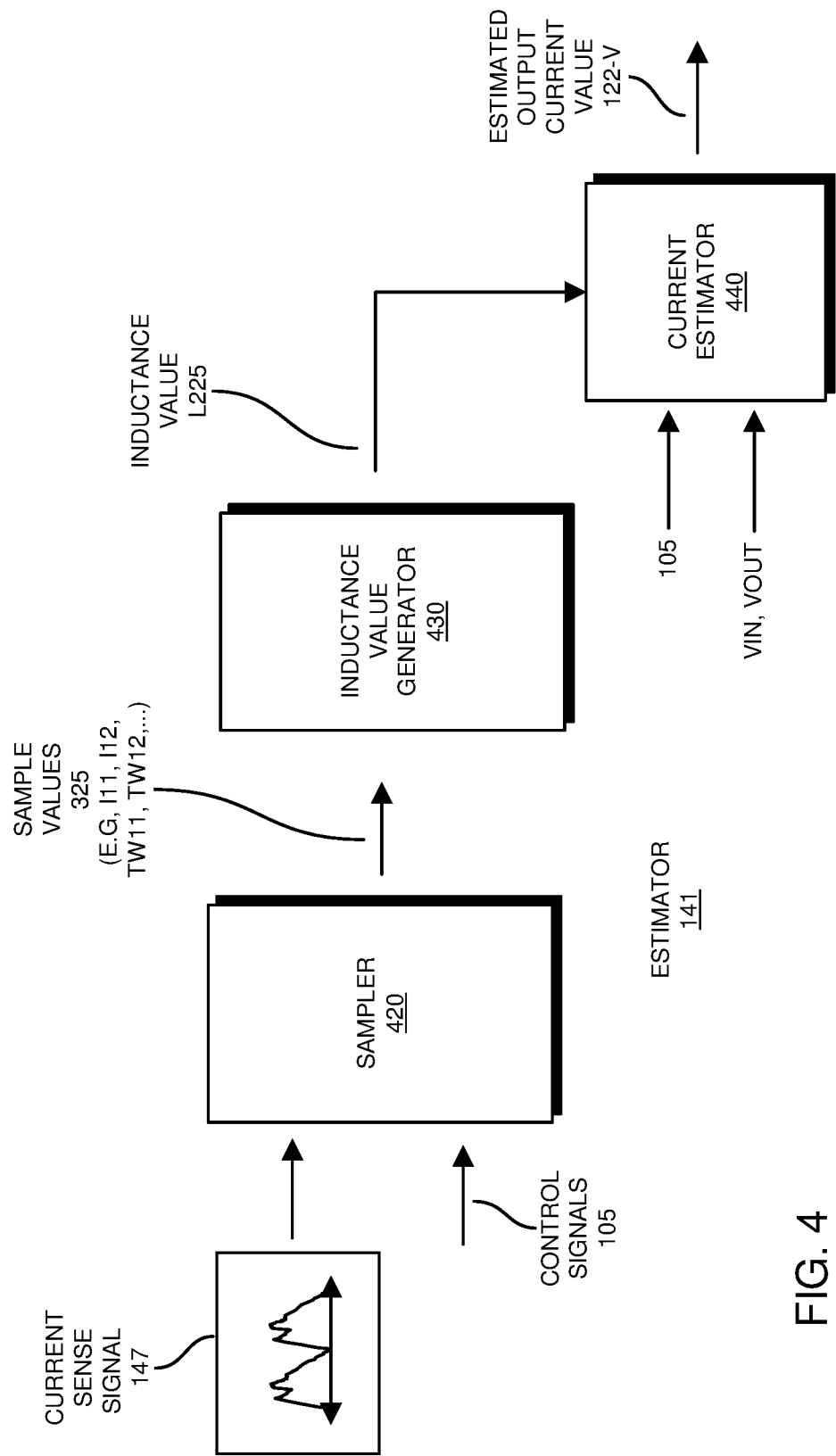
FIG. 4 is an example diagram illustrating generation of an inductance value of an inductor and use of the generated inductance value to estimate current through the inductor according to embodiments herein.

FIG. 4 is an example diagram illustrating generation of an inductance value of an inductor and use of the generated inductance value to estimate current through the inductor according to embodiments herein.

In one embodiment, the estimator 141 includes sampler 420, inductance value generator 430, and current estimator 440.

During operation, the sampler 420 receives current sense signal 147 and control signals 105. For each selected window in a respective power delivery control cycle, the sampler 325 produces sample values (such as I11, I12, TW11, TW12, etc.) as further discussed below in FIGS. 5 and 6.

As its name suggests, the inductance value generator 430 generates a respective inductance value L225 for each window of time based on sample values 325. In one embodiment, the estimator 141 determines the inductance value L225 of inductor 225 based on a slope of the current sense signal 147 (di/dt=change in current/change in time) in the selected window.

Thus, embodiments herein include, via the current sense signal 147, the estimator 141: i) selects a window of time; ii) measures a change in a magnitude of the current sense signal 147 during the window of time; and iii) derives the inductance (value) L225 of the inductor 225 based on a combination of a duration of the window of time and the change in the magnitude of the output current 122 during the window of time as applied to the current sense signal 147.

As further shown, after generating the inductance values L225, the current estimator 440 generates the inductor current values 122-V. For example, the estimator 141 receives the control signals 105 as well as values of the input voltage 121 and the output voltage 123. Via such information, the current estimator 440 produces accurate inductor output current values 122-V over time (FIG. 3).

Via the inductor output current values 122-V, the controller 140 is able to determine a specific amount of output current 122 through the inductor 225 at a given instant in time, average amount of inductor output current, etc., to control the voltage converter 135.

Figure 5:
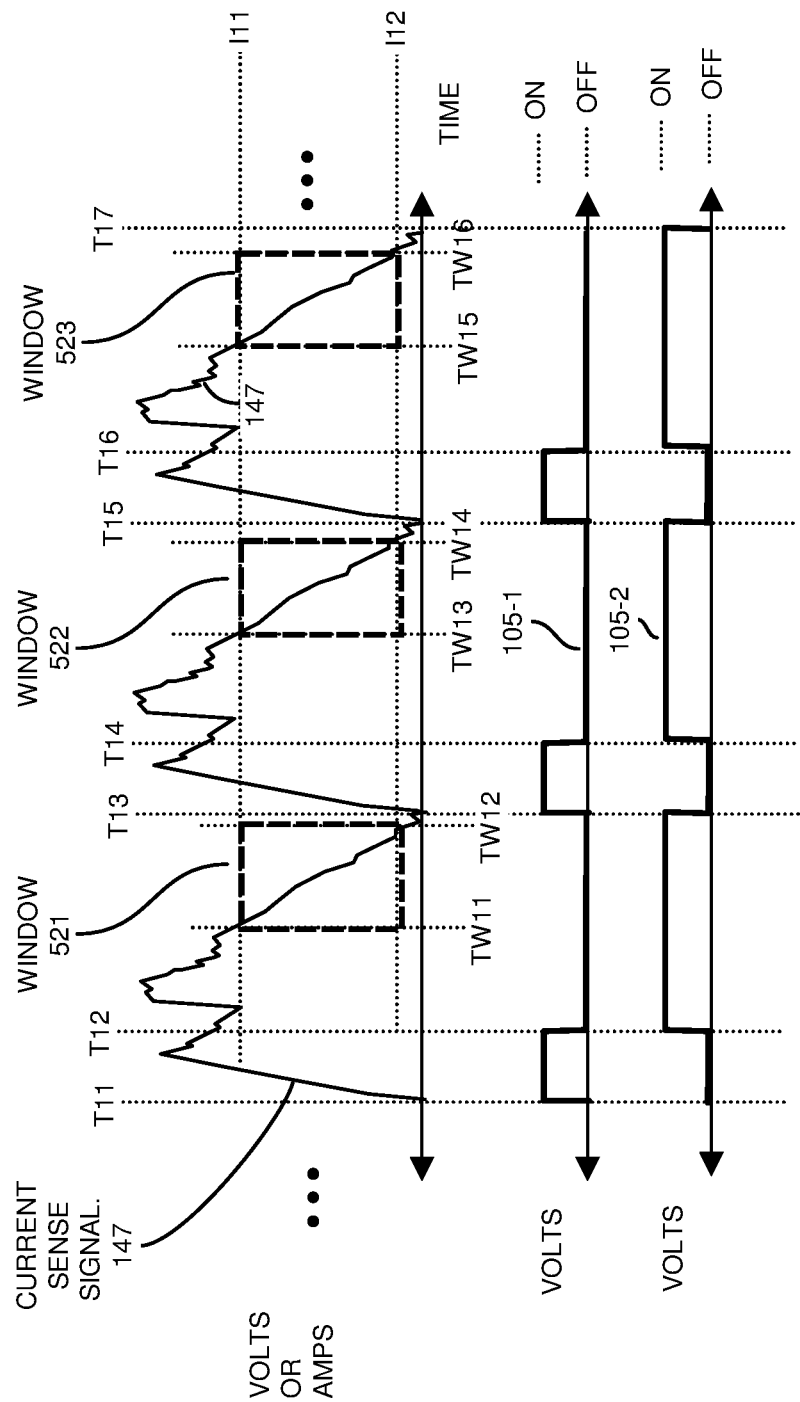
FIG. 5 is an example diagram illustrating analysis of a current sense signal during one or more windows of time to generate one or more inductance values according to embodiments herein.

FIG. 5 is an example diagram illustrating analysis of a current sense signal during one or more windows of time to generate one or more inductance values according to embodiments herein.

As previously discussed, embodiments herein include the observation that the current sense signal 147 may accurately depict the amount of output current 122 through the inductor 225 for one or more first portions (such as window 521, window 522, window 523, etc.) of the current sense signal 147; the current sense signal 147 may be inaccurate in depicting the amount of current 122 through the inductor 225 for one or more second portions (such as outside of window 521 between time TW11 and TW12, outside of window 522 between time TW13 and TW15, outside of window 523 between time TW15 and TW17, etc.) of the current sense signal 147.

A portion of the current sense signal 147 may be accurate just after time T11, T13, etc., in each cycle when the high side switch circuitry Q1 is ON. These portions could be used as windows to derive the inductance value of the inductor 225. However, the slope is quite steep when the high side switch circuitry Q1 is ON, making it a little more difficult to obtain a precise time and magnitude information. Thus, in one embodiment, it may be desirable to use the windows during activation of the low side switch circuitry Q2 which results in a less steep slope in the change of current over time.

In such an instance, the one or more first portions (windows 521, 522, 523, etc.) of the current sense signal 147 that accurately depict the amount of current 122 through the inductor 225 are used to determine the inductance L225 of the inductor 225 and, thereafter, the amount of output current 122 for an entirety each of the power delivery cycles.

One embodiment herein includes selecting a difference threshold value (such as based on change in current associated with each window) and using the window to determine corresponding times TW11 and TW12 associated with window 521, corresponding times TW13 and TW14 associated with window 522, etc.

As previously discussed, the estimator 141 calculates the inductance value L225 of the inductor 140 based on one or more samples window of the current sense signal 147. In one embodiment, each sample window (such as a portion of the current sense signal 147 that is deemed to be more or most accurate) is a less-than-all portion of a power delivery control cycle during which the power converter 165 supplies the output current 122 through the inductor 225 to the load 118.

In one embodiment, as previously discussed, the sample windows (such as each of windows 521, 522, 523, etc.) are chosen depending on respective states of switches Q1 and Q2 in the power converter 165 generating the output current 122.

For example, in one embodiment, the emulator 141 selects the window based on a time when the low side switch circuitry Q2 is activated to an ON state just prior to turning ON the high side switch circuitry Q1 because the current sense signal 147 is more accurate in such selected windows.

Further embodiments herein include, if desired, averaging the slope of the current sense signal in multiple windows 521, 522, 523, etc., and deriving a respective inductance value L225 from the average slope information derived from multiple windows.

Yet further embodiments herein using a combination of one or more windows during the first portion of a power delivery control cycle when the high side switch circuitry is ON and one or more windows during the second portion of a power delivery control cycle when the low side switch circuitry is ON to calculate a respective inductance value L225 from the current sense signal 147.

Figure 6:
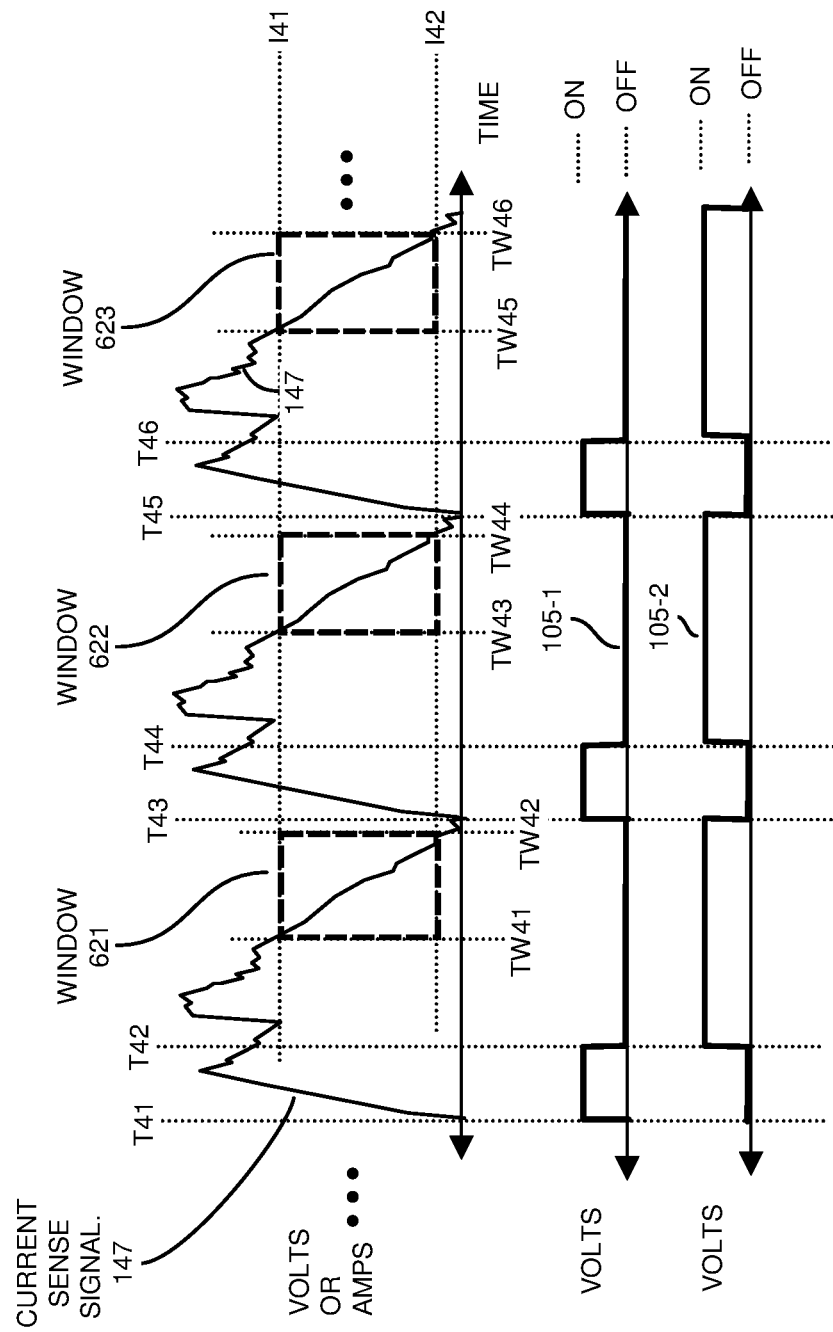
FIG. 6 is an example diagram illustrating analysis of a current sense signal during one or more windows of time to generate inductance values according to embodiments herein.

FIG. 6 is an example diagram illustrating analysis of a current sense signal during one or more windows of time to generate inductance values according to embodiments herein.

In a similar manner as previously discussed, the estimator 141 calculates the one or more inductance values L225 of the inductor 140 based a sample windows 621, 622, 623, etc., of the current sense signal 147.

Figure 7:
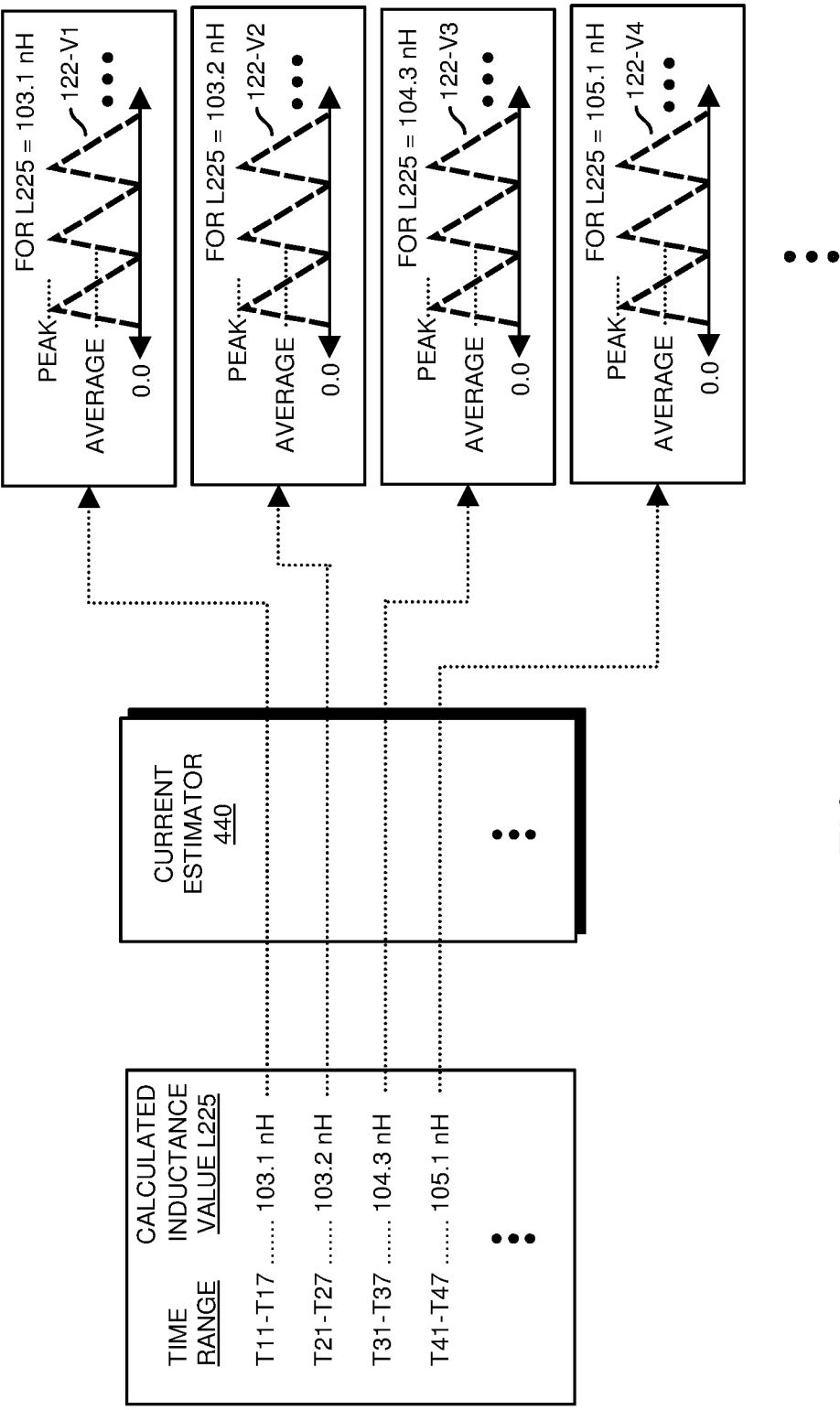
FIG. 7 is an example time diagram illustrating dynamic generation of estimated inductor current based on different generated inductance values over time according to embodiments herein.

FIG. 7 is an example time diagram illustrating dynamic generation of estimated inductor current based on different generated inductance values over time according to embodiments herein.

As previously discussed, the estimator 141 estimates a magnitude of the inductance associated with the inductor 225 in any suitable manner. For example, as previously discussed, in one embodiment, the estimator 141 calculates (estimates) a magnitude of the output current 122 supplied through the inductor 225 based one or more parameters such as: i) the calculated inductance (such as based on inductance value L225) of the inductor 225, ii) a magnitude of the input voltage 121 of the power converter 165 (such as a DC-DC power converter), the power converter 165 being operative to convert the input voltage 121 (such as a DC input voltage) into the output voltage 123 (such as a DC output voltage), iii) a magnitude of the output voltage 123 of the power converter 165 powering the load 118, etc.

Thus, subsequent to calculating the inductance (L225) of the inductor 225 based upon the more accurate less-than-all portions (such as window 521, window 522, window 523, . . . , window 521, window 522, window 523, . . . ) of respective power delivery cycles, the estimator 141 estimates a magnitude of the output current 122 supplied to the load 118 for the entire duration of the power delivery control cycle based on the calculated inductance (L225) of the inductor 225. The estimation of inductor output current 122 is more accurate than as indicated by the current sense signal 147 itself.

As further shown in this example embodiment, the estimator 141 calculates the inductance of the inductor 225 to be 103.1 nanoHenries (nH) between time range T11 and T17 (FIG. 3); the estimator 141 calculates the inductance of the inductor 225 to be 103.2 nanoHenries (nH) between time range T21 and T27; the estimator 141 calculates the inductance of the inductor 225 to be 104.3 nanoHenries (nH) between time range T31 and T37; the estimator 141 calculates the inductance of the inductor 225 to be 105.1 nanoHenries (nH) between time range T41 and T47 (FIG. 6); and so on.

As previously discussed in FIG. 4, as well as elsewhere throughout this specification, embodiments herein include using the generated inductance value L225 at different times as well as values of input voltage 121, output voltage 123, etc., to derive a more accurate representation of inductor output current 122.

More specifically, for time range T11-T17, the current estimator 340 (of estimator 141) uses the inductance value L225=103.1 nH and the input voltage 121 and output voltage 123 to generate the corresponding actual inductance current 122-V1; for time range T21-T27, the current estimator 340 (of estimator 141) uses the inductance value L225=103.2 nH and the input voltage 121 and output voltage 123 to generate the corresponding actual inductance current 122-V2; for time range T31-T37, the current estimator 340 (of estimator 141) uses the inductance value L225=104.3 nH and the input voltage 121 and output voltage 123 to generate the corresponding actual inductance current 122-V3; for time range T41-T47, the current estimator 340 (of estimator 141) uses the inductance value L225=105.1 nH and the input voltage 121 and output voltage 123 to generate the corresponding actual inductance current 122-V4; and so on.

Referring again to FIG. 3 and FIG. 7, the current estimator 440 associated with the estimator 141 produces the actual inductor current value 122-V (such as 122-V1, 122-V2, 122-V3, etc.) based on the estimated inductance L225 associated with the inductor 225 as well as the controls signals 105, the input voltage 121, and the output voltage 123.

To generate the actual current value 122-V for each inductance value, at time T11 in graph 320, it is known that the current through the inductor 225 is zero. During activation of the switch Q1 between time T11 and T12, time T13 and T14, etc., the current through the inductor 225 monotonically increases at a rate of:

$$dI=(Vin-Vout)*dT/L$$

where dI=change in inductor output current 122 over time, Vin=the voltage at node 296 (such as 12 VDC in this example because switch Q1 passes the input voltage to node 296), Vout=a magnitude of the output voltage 123 (such as 1.0 VDC in this example), dT=change in time, and L is the inductance of the inductor 225 (such as 103.1, 103.2, 104.3, etc., for each instance).

Accordingly, between each of the time range T11 and T12, time range T13 and T14, etc., the actual amount of the output current 122 monotonically increases.

Conversely, when control signal 105-1 drives switch Q1 to an OFF state and control signal 105-2 drives switch Q2 to an ON state, the change in current through the inductor 225 between time T12 and T13, time T14 and T15, etc., is as follows:

$$dI=(-Vout)\times dT/L$$

where dI=change in current over time, the voltage at node 296 (such as 0vDC in this example because switch Q2 is ON, Vout=a magnitude of the output voltage 123 (such as 1.0 VDC in this example), dT=sample duration, and L is the inductance of the inductor 225 (such as 103.1, 103.2, 104.3, etc., for each instance).

Based on such processing, the estimator 141 produces the estimated actual current values 122-V1, 122-V2, 12-V3, 122-V4, etc., based on the different inductor values 103.1 nH, 103.2 nH, 104.3 nH, 105.1 nH, etc.

Figure 8:
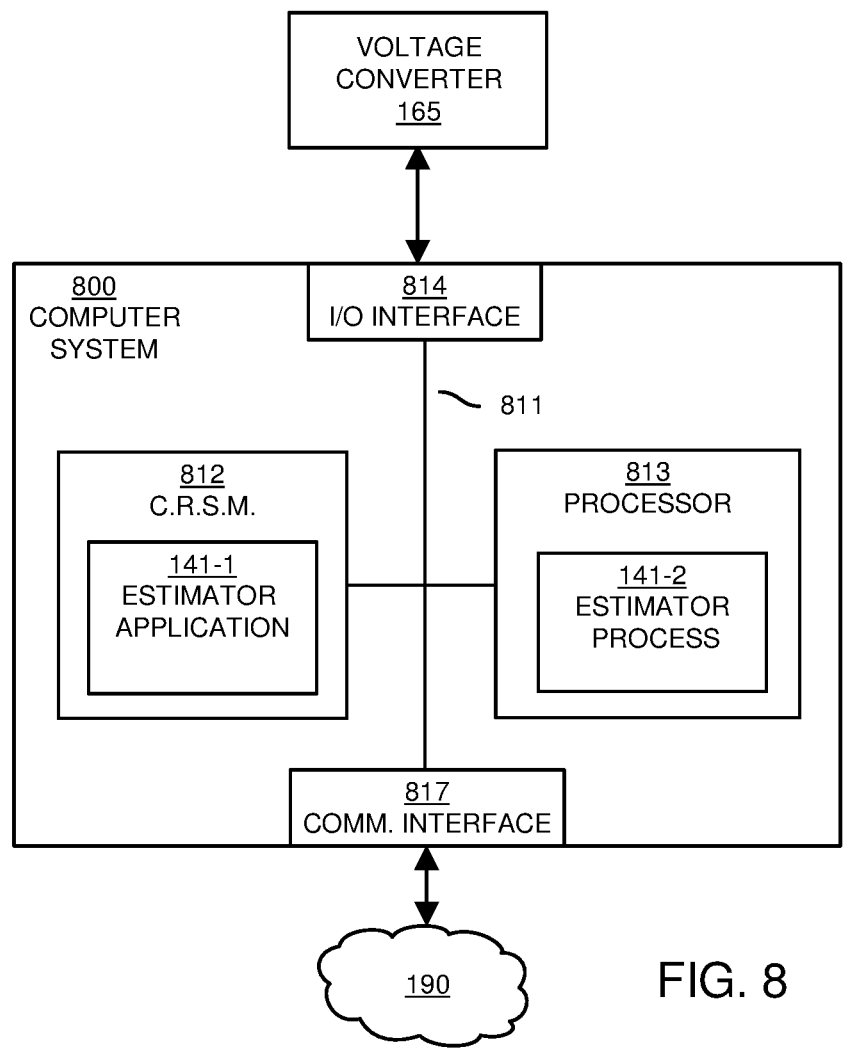
FIG. 8 is an example diagram illustrating computer processor hardware and related software instructions that execute methods according to embodiments herein.

FIG. 8 is an example block diagram of a computer device for implementing any of the operations as discussed herein according to embodiments herein.

As shown, computer system 800 (such as implemented by any of one or more resources such as controller 140, estimator 141, output current measurement resource 150, etc.) of the present example includes an interconnect 811 that couples computer readable storage media 812 such as a non-transitory type of media (or hardware storage media) in which digital information can be stored and retrieved, a processor 813 (e.g., computer processor hardware such as one or more processor devices), I/O interface 814, and a communications interface 817.

I/O interface 814 provides connectivity to any suitable circuitry such as power voltage converter 165.

Computer readable storage medium 812 can be any hardware storage resource or device such as memory, optical storage, hard drive, floppy disk, etc. In one embodiment, the computer readable storage medium 812 stores instructions and/or data used by the estimator application 140-1 to perform any of the operations as described herein.

Further in this example embodiment, communications interface 817 enables the computer system 800 and processor 813 to communicate over a resource such as network 190 to retrieve information from remote sources and communicate with other computers.

As shown, computer readable storage media 812 is encoded with estimator application 140-1 (e.g., software, firmware, etc.) executed by processor 813. Estimator application 140-1 can be configured to include instructions to implement any of the operations as discussed herein.

During operation of one embodiment, processor 813 accesses computer readable storage media 812 via the use of interconnect 811 in order to launch, run, execute, interpret or otherwise perform the instructions in estimator application 140-1 stored on computer readable storage medium 812.

Execution of the estimator application 140-1 produces processing functionality such as estimator process 140-2 in processor 813. In other words, the estimator process 140-2 associated with processor 813 represents one or more aspects of executing estimator application 140-1 within or upon the processor 813 in the computer system 800.

In accordance with different embodiments, note that computer system 800 can be a micro-controller device, logic, hardware processor, hybrid analog/digital circuitry, etc., configured to control a power supply and perform any of the operations as described herein.

Functionality supported by the different resources will now be discussed via flowchart in FIG. 9. Note that the steps in the flowcharts below can be executed in any suitable order.

Figure 9:
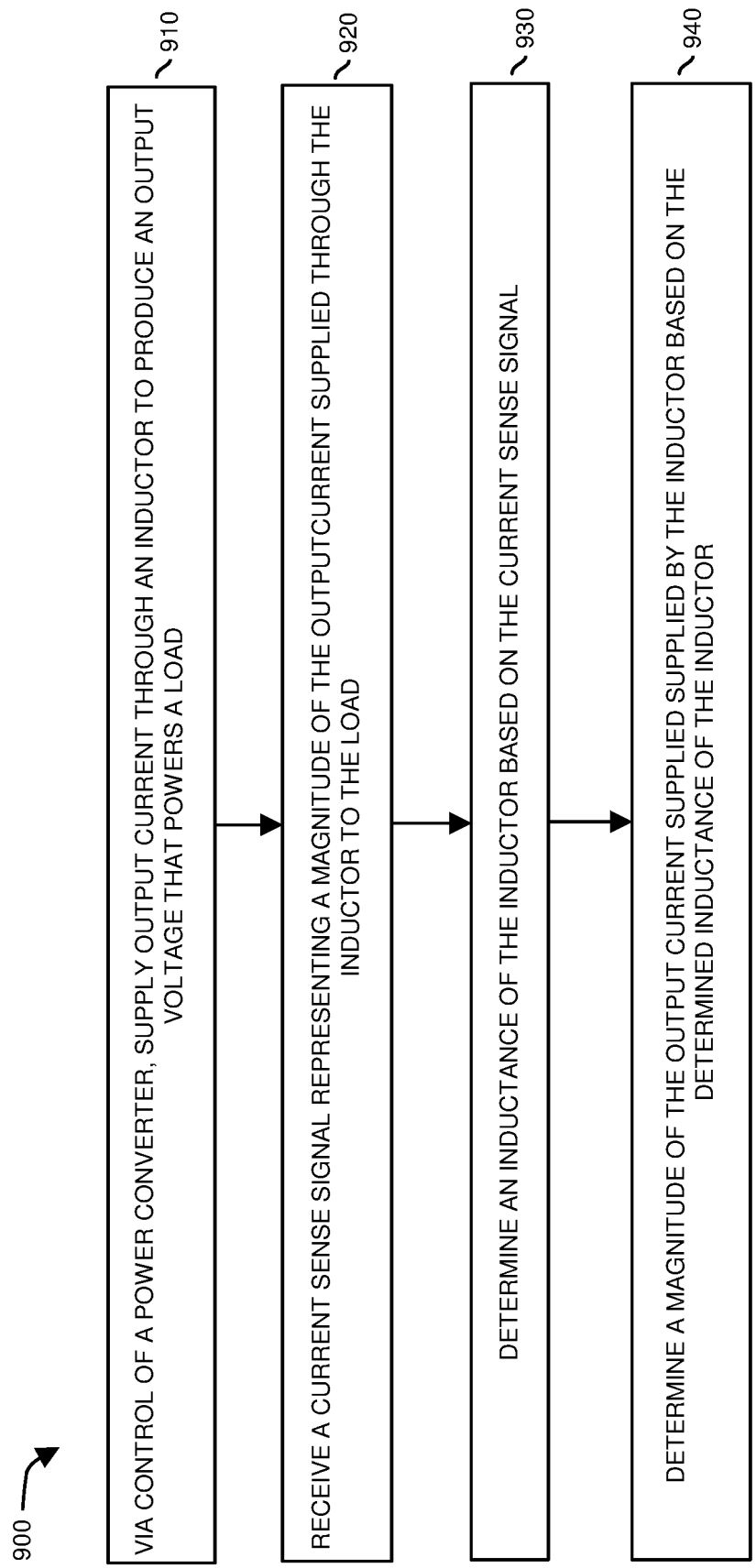
FIG. 9 is an example diagram illustrating a method according to embodiments herein.

FIG. 9 is an example diagram illustrating a method of controlling a power converter according to embodiments herein.

In processing operation 910, the estimator 141 receives a current sense signal 147 representing a magnitude of inductor output current 122 supplied through an inductor 225 of a power converter 135 to a load 118.

In processing operation 920, the estimator 141 determines an inductance value L225 of the inductor 225 based on the current sense signal 147.

In processing operation 930, the controller 140 controls operation of the power converter 135 based on the determined inductance value L225.

Figure 10:
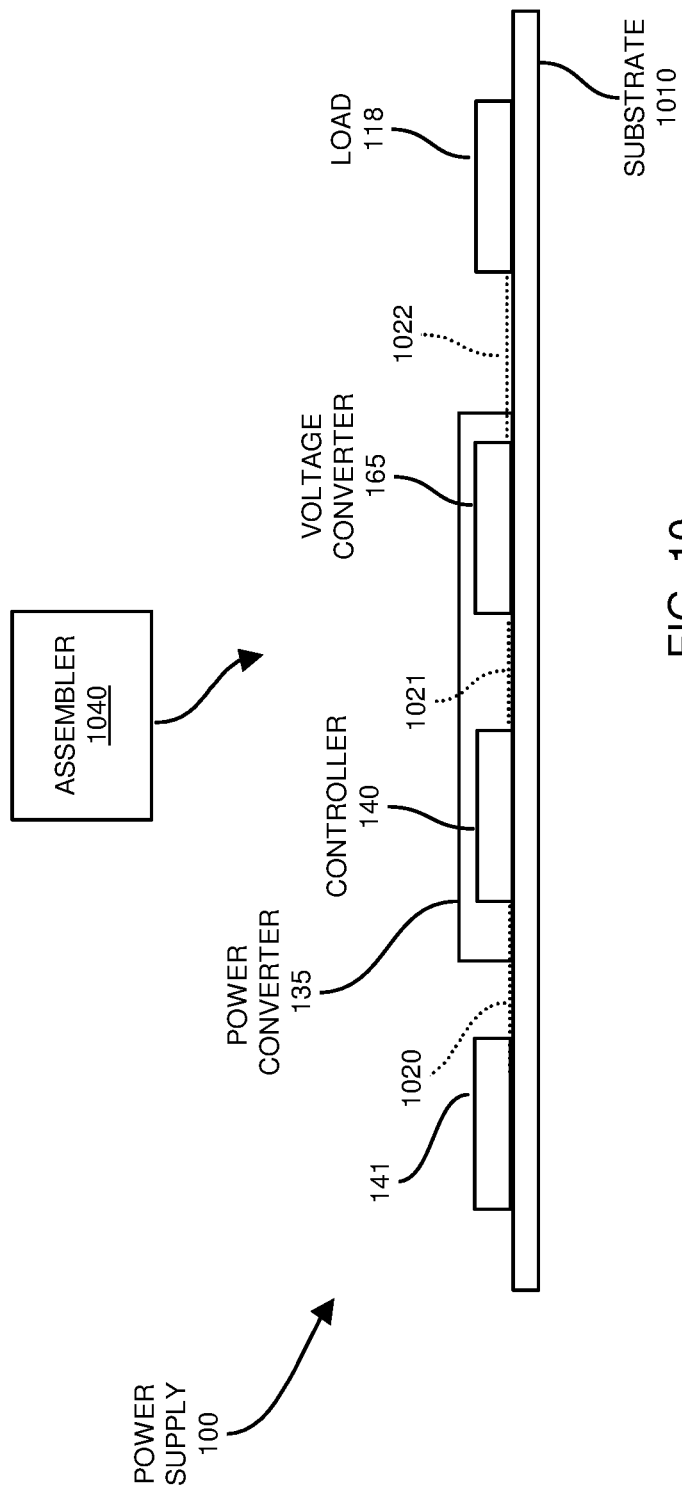
FIG. 10 is an example diagram illustrating assembly of a circuit according to embodiments herein.

FIG. 10 is an example diagram illustrating assembly of a power converter circuit on a circuit board according to embodiments herein.

In this example embodiment, assembler 1040 receives a substrate 1010 (such as a circuit board).

The assembler 1040 further affixes (couples) the controller 140 and voltage converter 165 (and corresponding components such as estimator 141, output current measurement resource 150, etc., associated with the power converter 135) to the substrate 1010.

Via circuit paths 1021 (such as one or more traces, electrical conductors, cables, wires, etc.), the assembler 1040 couples the controller 140 to the voltage converter 165. Note that components such as the controller 140, voltage converter 165, and corresponding components such as estimator 141, output current measurement resource 150, etc., associated with the power converter 135 can be affixed or coupled to the substrate 1010 in any suitable manner. For example, one or more of the components in power supply 100 can be soldered to the substrate, inserted into sockets disposed on the substrate 1010, etc.

Note further that the substrate 1010 is optional. Circuit paths 1020, 1021, 1022, etc., may be disposed in cables providing connectivity between the power converter 135 and the load 118.

In one nonlimiting example embodiment, the load 118 is disposed on its own substrate independent of substrate 1010; the substrate of the load 118 is directly or indirectly connected to the substrate 1010. The controller 140 or any portion of the power converter 135 can be disposed on a standalone smaller board plugged into a socket of the substrate 1010.

Via one or more circuit paths 1022 (such as one or more traces, cables, connectors, wires, conductors, electrically conductive paths, etc.), the assembler 1040 couples the voltage converter 165 to the load 118. In one embodiment, the circuit path 1022 conveys the output voltage 123 (and output current 122) generated from the voltage converter 165 to the load 118.

Accordingly, embodiments herein include a system comprising: a substrate 1010 (such as a circuit board, standalone board, mother board, standalone board destined to be coupled to a mother board, host, etc.); a voltage converter 165 including corresponding components as described herein; and a load 118. As previously discussed, the load 118 is powered based on conveyance of output voltage 123 and corresponding current 122 conveyed over one or more circuit paths 1022 from the voltage converter 165 to the load 118.

Note that the load 118 can be any suitable circuit or hardware such as one or more CPUs (Central Processing Units), GPUs (Graphics Processing Unit) and ASICs (Application Specific Integrated Circuits such those including one or more Artificial Intelligence Accelerators), which can be located on the substrate 1010 or disposed at a remote location.

Note again that techniques herein are well suited for use in circuit applications such as those that implement power conversion. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
   a power converter operative to produce an output voltage to power a load via current through an inductor during multiple power delivery cycles; and
   an estimator operative to:
   i) receive a current sense signal representing a magnitude of the current supplied through the inductor;
   ii) sample the current sense signal over a selected window of time to generate a plurality of samples; and
   iii) for a given power delivery cycle of the multiple power delivery cycles, determine an inductance of the inductor based on the plurality of samples; and
   wherein the given power delivery cycle includes multiple non-overlapping windows of time in which to select the window of time; and
   wherein the selected window of time is chosen from the multiple, non-overlapping windows of time by determining, based upon variations in a magnitude of a slope of the current sense signal, which of the multiple non-overlapping windows of time includes samples of the current sense signal that most accurately track an actual magnitude of the current through the inductor.

2. The apparatus as in claim 1, wherein the estimator is further operative to:
   estimate a magnitude of the current supplied through the inductor to the load based on the determined inductance of the inductor.

3. The apparatus as in claim 2, wherein the power converter includes a controller operative to control operation of the power converter based on the estimated magnitude of the current.

4. The apparatus as in claim 1, wherein the estimator is further operative to: repeatedly determine the inductance of the inductor based on multiple samples of the current sense signal obtained during each of the multiple power delivery control cycles of the power converter producing the output voltage.

5. The apparatus as in claim 1, wherein the estimator is further operative to:
   estimate the magnitude of the current supplied to the load based on:
   i) the determined inductance of the inductor,
   ii) a magnitude of an input voltage of the power converter, the power converter operative to convert the input voltage into the output voltage, and
   iii) a magnitude of the output voltage of the power converter powering the load.

6. The apparatus as in claim 1, wherein the estimator is further operative to:
   via the plurality of samples of the current sense signal, determine the slope of the current sense signal; and calculate the inductance based on the slope of the current sense signal in the selected window of time.

7. The apparatus as in claim 1, wherein the estimator is further operative to:
i) measure a change in a magnitude of the current supplied through the inductor based on the multiple samples of the current sense signal, the multiple samples obtained within the selected window of time; and
ii) derive the inductance of the inductor based on a duration of the selected window of time and the change in the magnitude of the current sense signal during the selected window of time.

8. The apparatus as in claim 7, wherein the power converter includes high side switch circuitry and low side switch circuitry activated at different times during each power delivery control cycle to control the magnitude of the current through the inductor; and
wherein the estimator is further operative to: select the window of time in the given power delivery control cycle to be within a duration of time in which the low side switch circuitry is activated, a magnitude of the current sense signal decreasing over the duration of time in which the low side switch circuitry is activated.

9. The apparatus as in claim 1, wherein the estimator is further operative to:
receive the current sense signal from a current monitor, the current monitor producing the current sense signal based on a change in voltage across a sense resistor in the power converter, the change in voltage caused by a flow of the current through the sense resistor.

10. The apparatus as in claim 1, wherein the estimator is further operative to:
via the current sense signal, determine a change in the magnitude of the current supplied through the inductor during the selected window of time; and
derive the inductance based at least in part on a duration of the selected window of time divided by the determined change in magnitude of the current supplied through the inductor.

11. The apparatus as in claim 1, wherein the estimator is further operative to:
determine the inductance of the inductor based on the multiple samples obtained during the selected window of time, the selected window of time being a less-than-all portion of the given power delivery control cycle during which the power converter supplies the current through the inductor to the load, the method further comprising:
subsequent to the given power delivery control cycle, estimate the magnitude of the current supplied to the load over an entire duration of a second power delivery control cycle based on the determined inductance of the inductor for the given power delivery control cycle.

12. A system comprising:
a circuit substrate;
the apparatus of claim 1, the apparatus coupled to the circuit substrate.

13. A method comprising:
receiving a circuit substrate; and
coupling the apparatus of claim 1 to the circuit substrate.

14. The apparatus as in claim 1, wherein the estimator is further operative to:
estimate the magnitude of the current supplied by the inductor to the load based on a magnitude of an input voltage of the power converter, the power converter operative to convert the input voltage into the output voltage.

15. The apparatus as in claim 1, wherein the estimator is further operative to: estimate the magnitude of the current supplied by the inductor to the load based on the determined inductance and a magnitude of the output voltage of the power converter powering the load.

16. The apparatus as in claim 1, wherein the plurality of samples include a first sample magnitude of the current sense signal obtained at a first instance of time and a second sample magnitude of the current sense signal obtained at a second instance of time; and
wherein the estimator is further operative to determine the inductance of the inductor based at least in part on a difference between the first sample magnitude and the second sample magnitude.

17. The apparatus as in claim 1, wherein the magnitude of the current sense signal used to determine the inductance of the inductor varies as a function of time and a magnitude of the current consumed by the load.

18. The apparatus as in claim 1, wherein the plurality of samples of the current sense signal are obtained during the selected window of time during which a magnitude of the current sense signal monotonically changes for an entire duration of the selected window of time.

19. The apparatus as in claim 1, wherein selection of the window of time depends on a state of switches controlling a magnitude of the current through the inductor.

20. The apparatus as in claim 1, wherein the estimator is further operative to:
via the plurality of samples, determine the inductance of the inductor for a first power delivery control cycle of producing the output voltage and the current; and
based on the determined inductance, calculate the magnitude of the current supplied by the inductor to the load for a second power delivery control cycle following the first power delivery control cycle.

21. A method comprising:
via control of a power converter during multiple power delivery cycles, supplying output current through an inductor to produce an output voltage that powers a load;
receiving a current sense signal representing a magnitude of the output current supplied through the inductor to the load;
sample the current sense signal over a selected window of time to generate a plurality of samples;
for a given power delivery cycle of the multiple power delivery cycles, determining an inductance value of the inductor based on the plurality of samples of the current sense signal;
wherein the given power delivery cycle includes multiple non-overlapping windows of time in which to select the window of time; and
wherein the selected window of time is chosen from the multiple, non-overlapping windows of time by determining, based upon variations in a magnitude of a slope of the current sense signal, which of the multiple non-overlapping windows of time includes samples of the current sense signal that most accurately track an actual magnitude of the output current through the inductor.

22. The method as in claim 21 further comprising:
estimating a magnitude of the output current supplied through the inductor based on the determined inductance of the inductor.

23. The method as in claim 22 further comprising:
controlling operation of the power converter based on the estimated magnitude of the output current.

24. The method as in claim 21 further comprising:
repeatedly determining the inductance of the inductor based on multiple samples of the current sense signal obtained during each of multiple power delivery control cycles of controlling the power converter to produce the output voltage.

25. The method as in claim 21 further comprising:
estimating the magnitude of the output current supplied to the load based on:
  i) the determined inductance of the inductor,
  ii) a magnitude of an input voltage of the power converter, the power converter operative to convert the input voltage into the output voltage, and
  iii) a magnitude of the output voltage of the power converter powering the load.

26. The method as in claim 21 further comprising:
via the plurality of samples of the current sense signal, determining the slope of the current sense signal; and
calculating the inductance based on the slope of the current sense signal.

27. The method as in claim 21, wherein determining the inductance includes:
  i) measuring a change in a magnitude of the current sense signal during the selected window of time based on the plurality of samples of the current sense signal; and
  ii) deriving the inductance of the inductor based on a duration of the selected window of time and the change in the magnitude of the current sense signal during the selected window of time.

28. The method as in claim 27, wherein the power converter includes high side switch circuitry and low side switch circuitry activated at different times during a power delivery control cycle to control the magnitude of the output current through the inductor, the method further comprising:
selecting the window of time in the power delivery control cycle to be within a duration of time in which the low side switch circuitry is activated, a magnitude of the current sense signal decreasing over the duration of time in which the low side switch circuitry is activated.

29. The method as in claim 21 further comprising:
receiving the current sense signal from a current monitor, the current monitor producing the current sense signal based on a change in voltage across a sense resistor in the power converter, the change in voltage caused by a flow of the output current through the sense resistor.

30. The method as in claim 21, wherein determining the inductance includes:
via the current sense signal, determining a change in the magnitude of the output current during the selected window of time; and
deriving the inductance based at least in part on a duration of the selected window of time divided by the determined change in magnitude of the output current.

31. The method as in claim 21, wherein determining the inductance includes: determining the inductance of the inductor based on the plurality of samples obtained during the selected window of time, the selected window of time being a less-than-all portion of a first power delivery control cycle during which the power converter supplies the output current through the inductor to the load, the method further comprising:
subsequent to the first power delivery control cycle, estimating the magnitude of the output current supplied to the load over an entire duration of a second power delivery control cycle based on the determined inductance of the inductor for the first power delivery control cycle.

32. Computer-readable storage media having instructions stored thereon, the instructions, when executed by computer processor hardware, cause the computer processor hardware to:
receive a current sense signal representing a magnitude of output current supplied through an inductor of a power converter to a load during multiple power delivery cycles;
sample the current sense signal over a selected window of time to generate a plurality of samples;
for a given power delivery cycle of the multiple power delivery cycles, determine an inductance value of the inductor based on the plurality of samples of the current sense signal; and
control operation of the power converter based on the determined inductance;
wherein the given power delivery cycle includes multiple non-overlapping windows of time in which to select the window of time; and
wherein the selected window of time is chosen from the multiple, non-overlapping windows of time by determining, based upon variations in a magnitude of a slope of the current sense signal, which of the multiple non-overlapping windows of time includes samples of the current sense signal that most accurately track an actual magnitude of the current through the inductor.

* * * * *